United States Patent

August et al.

[15] 3,670,218

[45] June 13, 1972

[54] MONOLITHIC HETEROEPITAXIAL MICROWAVE TUNNEL DIE

[72] Inventors: Rudolf R. August, Laguna Beach; Richard L. Palmquist, Anaheim, both of Calif.

[73] Assignee: North American Rockwell Corporation

[22] Filed: Aug. 2, 1971

[21] Appl. No.: 168,452

Related U.S. Application Data

[63] Continuation of Ser. No. 805,304, March 7, 1969, abandoned.

[52] U.S. Cl. .....................317/235 R, 317/235 K, 317/235 L, 317/234 N, 317/235 AC, 29/580, 148/177

[51] Int. Cl. .......................................H01l 11/00, H01l 15/00

[58] Field of Search .........317/235 K, 235 L, 235 AC, 234 N; 148/177, 178; 29/580; 330/4.9

[56] References Cited

UNITED STATES PATENTS

| | | | |
|---|---|---|---|
| 2,972,092 | 2/1961 | Nelson | 317/234 |
| 3,065,391 | 11/1962 | Hall | 317/234 |
| 3,184,659 | 5/1965 | Cohen | 317/235 |
| 3,375,145 | 3/1968 | Setchfield et al. | 317/235 |
| 3,375,416 | 3/1968 | Adams et al. | 317/235 |
| 3,391,346 | 7/1968 | Uhlir | 317/235 |
| 3,408,732 | 11/1968 | Smith et al. | 317/235 |

*Primary Examiner*—John W. Huckert
*Assistant Examiner*—Andrew J. James
*Attorney*—Roger G. Rogers, William R. Cane, L. Lee Humphries, H. Frederick Hamann and Edward Dugas

[57] ABSTRACT

A monolithic heteroepitaxial microwave tunnel diode with a vertical tunnel junction is manufactured from an insulating substrate on which a layer of p-type semiconductor material has been grown. A layer of dielectric thin film is placed over the p-type semiconductor layer and where an ohmic contact is desired an opening is formed in the dielectric thin film. A circuit metal is then alloyed to the p-type semiconductor material. A similar opening is formed where a tunnel junction is desired and a second metal is alloyed to the p-type semiconductor material. An n-type semiconductor region is formed during the second alloying.

15 Claims, 11 Drawing Figures

INVENTORS
RUDOLPH R. AUGUST
RICHARD L. PALMQUIST
BY Edward Dugas
ATTORNEY

INVENTORS
RUDOLPH R. AUGUST
RICHARD L. PALMQUIST
BY Edward Dugas
ATTORNEY

INVENTORS
RUDOLPH R. AUGUST
RICHARD L. PALMQUIST
BY Edward Degas
ATTORNEY

MONOLITHIC HETEROEPITAXIAL MICROWAVE TUNNEL DIE

This application is a continuation of Ser. No. 805,304, filed 3/7/69 now abandoned.

BACKGROUND OF THE INVENTION

This invention pertains to the field of microwave tunnel diodes and, more particularly, to monolithic heteroepitaxial microwave tunnel diodes with a vertical junction.

In the field of tunnel diode fabrication one of the major goals of any tunnel diode manufacturing process is to achieve an abrupt and distinct boundary at the tunnel junction. The more abrupt the tunnel junction, the better the tunnel diode characteristics. Toward this goal, several fabrication processes have been developed.

One process described as the dot-alloy process comprises cutting a germanium crystal doped with arsenic of the proper concentration into base pellets. To the germanium crystal is alloyed a dot of indium containing about 1 percent gallium by weight. Uniform pelting is obtained by the use of an acid flux in a closely controlled temperature range. After the alloying process, pellets are soldered to a nickel base tab or on to a gold plated Kovar enclosure. Finally a platinum wire is fused to the indium dot.

The dot-alloy process produces tunnel diodes of greatly varying characteristics even though great care is taken to precisely control the temperature, heating time, and cooling rate of the process.

Another fabrication technique referred to as the solution-growth process involves the growing of a highly doped p-type semiconductor layer onto a lapped n-type semiconductor surface. Typically, the n-type semiconductor surface is germanium cut normal to the (111) axis and the p-type semiconductor layer is highly doped germanium. The growing takes place typically in a furnace with a hydrogen atmosphere. Once the growth is complete the wafer of the p-type germanium can be used to prepare large lots of diodes by the use of masking and etching techniques or by lapping. In the techniques of masking, etching or lapping a portion of the p-type semiconductor surface layer is removed from the underlying wafer resulting in an array of tiny p-type masses formed on the n-type semiconductor wafer. Each of these masses will ultimately become a tunnel diode. This process, as noted, requires extensive etching to produce tunnel diodes with desired cutoff frequencies.

A familiar practice is to incapsulate each individual tunnel diode into a structure that can be readily mounted into a previously prepared electronic circuit. In such a situation, an externally manufactured tunnel diode, generally in a ceramic case with leads extending therefrom, is positioned on a previously prepared substrate. Leads from the tunnel diode are then welded or otherwise attached to gold strips or other conductors that form the tunnel diode contacts. Such a procedure results in what is referred to in the art as a hybrid structure. A disadvantage of a hybrid structure is that where the tunnel diode contacts the substrate a microwave perturbation occurs which effects the circuit performance.

The method of the present application results in a monolithic structure wherein the vertical junction of the tunnel diode is an integral part of the completed device. The need for mounting externally manufactured and ceramically cased tunnel diodes is completely eliminated. By eliminating the hybrid characteristics of the tunnel diode improved circuit performance is achieved. The present method is also free from any etching processes to reduce the tunnel depletion layer. In addition, a high degree of reliability is obtained from the present process. Still further, yields from the present process result in the uniformity required for mass electrical devices manufactured from a single wafer.

SUMMARY OF THE INVENTION

In a preferred embodiment of this invention, a layer of p-type semiconductor material is deposited on a layer of insulating substrate. A quantity of metal is deposited on a selected area of the p-type semiconductor. A eutectic is then formed between the deposited metal and a portion of the p-type semiconductor material.

A quantity of a second metal is deposited on the p-type semiconductor material. A eutectic is then formed between the p-type semiconductor material and the second metal resulting in the creation of an n-type semiconductor region at the interface of the p-type semiconductor material and the second metal.

In a second preferred embodiment of this method p-type semiconductor material is deposited on an insulating substrate. Insulators such as aluminum oxide, berillium oxide and sapphire may be used as an insulating substrate. On top of the layer of p-type semiconductor material there is deposited a layer of dielectric thin film. The dielectric thin film, which may be silicon oxide or silicon nitride, or some such material, serves as a mask for later alloying steps and also serves as a protective layer for the surface of the underlying p-type semiconductor. The layer of dielectric thin film extends over all the p-type semiconductor material.

Then dielectric thin film is removed from the wafer such that "windows" are cut to the p-type semiconductor material. The technique for removing the dielectric thin film controls the size of the "windows" to the p-type semiconductor material.

After the dielectric thin film has been removed to form a "-window", metal is alloyed to the p-type semiconductor material. The metal, such as zinc, is deposited adjacent to the p-type semiconductor material surface exposed in the window. The deposited metal extends from contact with the dielectric thin film and the p-type semiconductor material. The alloying of the metal to the p-type semiconductor material is affected by heating to a point where a eutectic is formed between the metal and the p-type semiconductor material. The metal and the p-type semiconductor material interface forms the ohmic contact portion of the tunnel diode. In the preferred embodiment the alloying step is done in a hydrogen or other reducing atmosphere.

Additional "windows" are now cut in the dielectric thin film of the wafer. These second "windows" are opposite but separated from the previously cut "windows" and the alloyed metal region. Separating the two "windows" is a strip or region of p-type semiconductor material underneath a layer of dielectric thin film.

A second metal, such as tin with sulfur at maximum solubility, is deposited in the second "window". The interface between the second metal and the p-type semiconductor material forms the vertical junction of the diode. The device is then heated to form a eutectic between the p-type semiconductor material and the second metal. During the heating, an n-type semiconductor region is created at the material interface.

It is important to achieve an abrupt interface between the p-type semiconductor material and the deposited second metal. This is achieved after heating the device to form a eutectic between the p-type semiconductor material and the second metal and by rapidly quenching the device.

At this point the vertical junction monolithic heteroepitaxial microwave tunnel diode is substantially complete. There remains, however, the process of putting gold or other conductive material contacts on each of the metal regions. These conductors then become available for attachment of the tunnel diode to other circuit elements.

Accordingly, it is the object of this invention to provide an improved tunnel diode.

Further, it is an object of this method to provide a tunnel diode manufacturing process that will result in production of a large number of tunnel diodes that exhibit substantially identical electrical characteristics. Variations that occur are a result of variations in the composition of the materials used as opposed to variations due to the manufacturing process.

It is still a further object of the present invention to provide microwave tunnel diodes with increased reliability due to improved structural integrity.

In addition, it is another object of this invention to provide a method wherein tunnel diodes of varying characteristics can be obtained from a single wafer by controlling the removal of the "windows" in the dielectric thin film and p-type semiconductor material that extend from the insulating substrate.

The aforementioned and other objects of the present invention will become more apparent and better understood when taken in conjunction with the following description and drawings, throughout which like characters indicate like parts, and which drawings form a part of this application.

BRIEF DESCRIPTION OF THE PREFERRED EMBODIMENT

Figure 1:
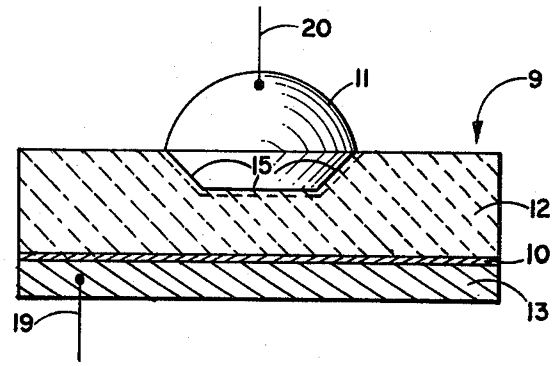
PRIOR ART FIG. 1
FIG. 1 is a cross-sectional view of a prior art device before any etching process.

The tunnel diode 9 of FIG. 1 is representative of prior art devices. A layer of p-type semiconductor material 12 extends over an ohmic contact 10. The ohmic contact 10 covers a heat sink 13. A dot of n-type semiconductor material 11 is alloyed to the p-type material 12 at interface 15. Electrical leads 19 and 20 extend from the device 9. A depletion layer along interface 15 is shown by dotted lines parallel to the interface 15.

The cutoff frequency for a tunnel diode is expressed by the relationship:

$$f_c \cong 1/R_s C_j$$

In the equation, the cutoff frequency $f_c$ is any convenient frequency of reference as long as the basic proportionality remains unchanged. $R_s$ is the series resistance of the tunnel diode and $C_j$ is the capacitance across the depletion layer of the tunnel junction. The cutoff frequency, $f_c$, can be increased by either reducing the series resistance $R_s$ or the capacitance $C_j$. The magnitude of $C_j$ is a function of the area of the interface between the p-type and n-type semiconductor materials. The larger the interface area, the larger $C_j$. Therefore, cutoff frequency can be increased by decreasing $C_j$, that is, by decreasing the area of the interface between the p and n-type materials.

The series resistance, $R_s$, of the diode is smaller for increased interface area. The smaller the interface area between the p and n-type materials the larger the electrical resistance due to the decreased cross-sectional area of the current path. Therefore, decreasing the area of the interface between the p and n-type material will increase cutoff frequency by decreasing the capacitive effect, but it will tend to decrease the cutoff frequency by increasing the series resistance. By suitably selecting the interface area some optimal relationship between junction capacitance and series resistance to yield a cutoff frequency for the desired circuitry can be achieved.

Figure 2:
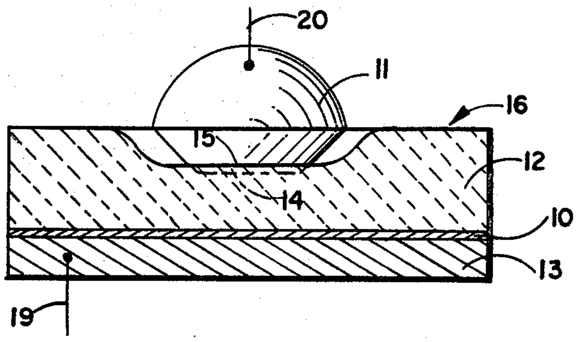
PRIOR ART FIG. 2
FIG. 2 is a cross-sectional view of a prior art device after partial etching of the depletion layer.
Figure 3:
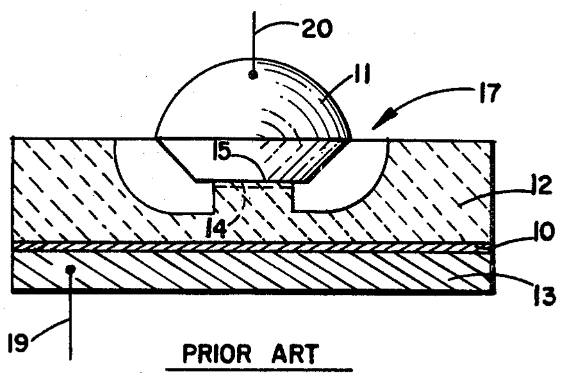
PRIOR ART FIG. 3
FIG. 3 is a cross-sectional view of a prior art device showing increased etching of the depletion layer.

An area of the interface 15 is etched away in FIG. 2 such that the interface 15 and associated depletion layer 14 is much less than before. FIG. 3 is a further reduction in interface area between the p and n-type materials resulting in the familiar (mushroom) tunnel diode. Etching to form a "mushroom" is an attempt to achieve the optimal relationship between series resistance and junction capacitance for a desired cutoff frequency. It will also be noted that in the mushroom tunnel diode of FIG. 3 the tunnel junction of the diode (interface 15) is horizontal.

Figure 4:
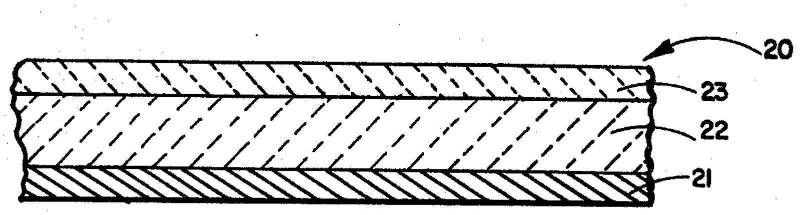
FIG. 4 is a cross-sectional view showing the p-type semiconductor material on the insulating substrate.

Manufacture of a monolithic tunnel diode of the instant invention begins with a substrate wafer as shown in FIG. 4. In the preferred embodiment a ground plane 21 is layered below an insulating substrate 22. The ground plane is not essential to the manufacture of tunnel diodes by the present method nor is it essential structurally to some tunnel diodes. The ground plane may, therefore, be omitted if desired. Preferred substrate material is sapphire although ceramic aluminum oxide or beryllium oxide may also be used. Placed over the insulating substrate 22 is a layer of p-type semiconductor material 23. Degenerate gallium arsenide zinc doped to an acceptor concentration of $2 \times 10^{19}/cm^3$ is one desired p-type semiconductor material although there are others. Recognition of the fact that insulating substrates need not be of the same basic material as the p-type semiconductor material, permits heteroepitaxial tunnel diodes to be manufactured by this method. The layers of ground plane 21, insulating substrate 22, and p-type semiconductor material 23 comprise the initial wafer 20.

Figure 5:
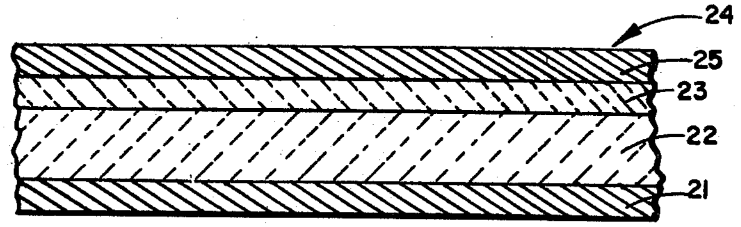
FIG. 5 is a cross-sectional view showing the addition of the dielectric thin film to the device of FIG. 4.

In FIG. 5 there is deposited on the p-type semiconductor material layer 23 a layer of dielectric thin film 25. The dielectric thin film 25 confines the alloys of later steps to discrete regions and also passivates the underlying p-type semiconductor material. The deposition of the layer of dielectric thin film may be by conventional methods. Materials such as silicon oxide and silicon nitride serve very well as thin film dielectrics for use as noted above.

Figure 6:
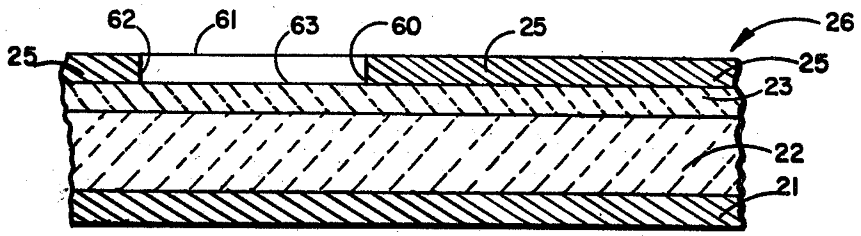
FIG. 6 is a cross-sectional view of the device of FIG. 5 after obtaining a "window" through the p-type semiconductor material and the dielectric thin film.

After the thin film dielectric 25 is deposited on the p-type semiconductor material 23, an undesired portion of dielectric thin film is removed leaving a "window" to the p-type semiconductor material 23 (see FIG. 6). The formation of the window may, of course, be by techniques well-known in the art.

Several "windows" may be formed at one time on the same wafer and, therefore, mass production of uniform tunnel diodes can be obtained by this method. The size of the windows may also be varied. As was described earlier, varying the tunnel junction interface area alters the diode's cutoff frequency. This means several tunnel diodes with different cutoff frequencies can be manufactured from the same wafer by simply varying the size of the "window".

FIG. 6 represents a cross-section of the device after the first "window" has been prepared and shows the "window" defined by surfaces 60 through 63. A percentage of the p-type semiconductor material 23 is used in later alloying steps where a eutectic is formed between the p-type semiconductor material 23 and the metal forming the ohmic contact.

Figure 7:
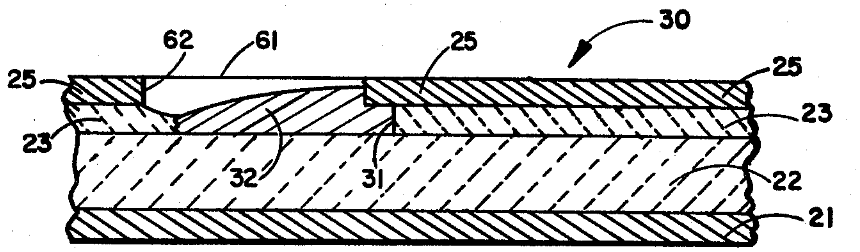
FIG. 7 is a cross-sectional view of the device of FIG. 6 after the alloying of a first metal to the device.

Referring now to FIG. 7, a first alloying step follows the forming of the first "window" or set of "windows". In the preferred embodiment, metal 32, such as zinc, is deposited on the p-type semiconductor material 23 adjacent to the p-type semiconductor material 23 and the dielectric thin film 25 in the "window". The entire device 30 and the metal are heated to approximately 300° C. The heating alloys the metal to the p-type semiconductor material 23 by a eutectic which is formed between the metal 32 and the p-type semiconductor material 23. The eutectic formed utilizes the portion of the p-type semiconductor material 23 that extended beyond the dielectric thin film 25 and a portion that which extends under the dielectric thin film too. As a result, the eutectic mixture of p-type semiconductor material 23 and metal penetrates under the dielectric thin film 25 to interface 31, as is shown in FIG. 7. The interface 31 becomes the ohmic contact for the tunnel diode. The manufacturing of the ohmic contact interface 31 is less critical than the manufacturing of the tunnel interface to be described later. With such being the case, the cooling after alloying of the ohmic contact may be by conventional methods and need not be precisely controlled. Metals other than zinc may also be used for this first alloying step. Such metals as silver, cadmium, and indium are suitable.

Figure 8:
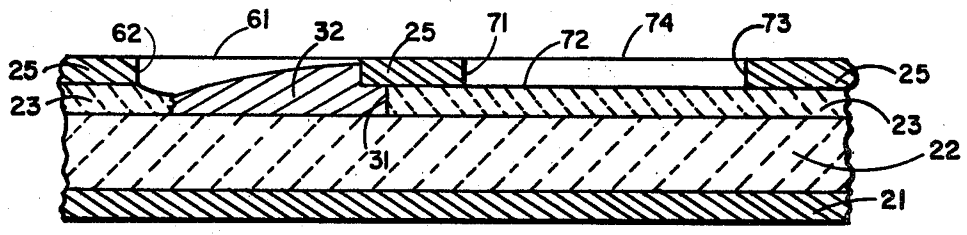
FIG. 8 is a cross-sectional view of the device of FIG. 7 after obtaining a second "window" through the p-type semiconductor material and the dielectric thin film.

After the first alloying, a second "window" or set of "windows" is made similar to the first "window" or set of "windows" as shown in FIG. 8. Interface 71 through 74 define this second "window". The second "window" is positioned opposite the first "window".

Figure 9:
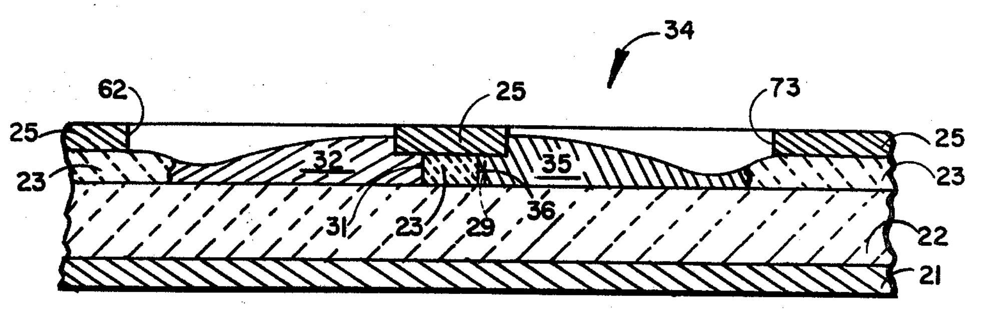
FIG. 9 is a cross-sectional view of the device of FIG. 8 after alloying of a second metal to the device.

Referring now to FIG. 9, a second metal 35, which participates in the growth of the n-region of the tunnel diode is placed in the second "window" adjacent to the p-type semiconductor material 23 and dielectric thin film 25 opposite the previously alloyed metal 32. Sulfur doped tin at maximum solubility is a preferred metal for this application although several other maximum saturated metals may be used.

The entire device is then heated to a temperature between 380° and 500° C. A temperature for this alloying step that yields good results is 500° C. The heating of the second metal 35 in close proximity to the p-type semiconductor material 23 and the dielectric thin film 25 causes a eutectic to form between the p-type semiconductor material and the second metal. A region of n-type semiconductor material 29 is grown at the interface between these two materials during the alloying step. As a result, a portion of the p-type semiconductor material is used in the eutectic mixture which again penetrates under the dielectric thin film layer 25. The resulting interface formed between the p-type semiconductor material 23 and the grown n-type semiconductor region 29 is the tunnel junction 36 of the diode device. The tunnel junction 36 is critical for proper operation of a tunnel diode in as much as the more well defined the interface 36 the thinner the depletion layer and the better the cutoff frequency of the tunnel diode. To achieve a well-defined junction the entire wafer is rapidly quenched after heating in a cooling solution such that cooling is abrupt. This results in clean interface 36 between the p-type semiconductor material 23 and the n-type semiconductor material 35.

The structure to this point is as shown in FIG. 9. FIG. 9 shows the ground plane 21 with thereon the layer of insulating substrate 22 which constituted the initial wafer. Remaining on the insulating substrate 22 is p-type semiconductor material 23 and the dielectric thin film 25. On one side of the p-type semiconductor material is the first alloyed metal. On the opposite side of the p-type semiconductor material 23 is the n-type semiconductor region 29 and the second alloyed metal 35. Ohmic contact 31 exists at the interface between the metal and the p-type semiconductor material 23 and tunnel junction 36 exists between the p-type semiconductor material and the grown n-type semiconductor material 29. It will be noted that the tunnel junction 36 is vertical.

Figure 10:
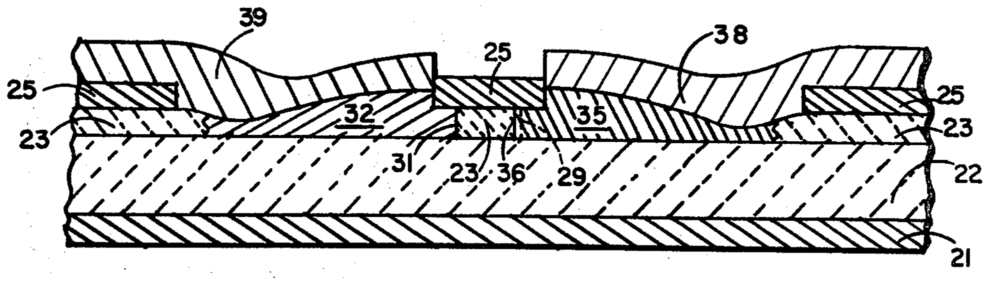
FIG. 10 is a cross-sectional view of the device of FIG. 8 after the addition of the conducting strips.

In order to utilize the manufactured tunnel diode suitable contacts must exist for incorporating the tunnel diode into a circuit. As shown in FIG. 10, this is accomplished by using familiar techniques to attach conducting elements such as gold or platinum to the regions of metal material. The conductor 39 is bonded to the metal region 32. Similarly, the conducting element 38 is bonded to the second metal 35. An electrical circuit through the tunnel diode device now exists from conductor 38 through the second metal 35 to the n-type semiconductor material 29, across the tunnel junction 36 into the p-type semiconductor material 23, then across the ohmic contact 31 into the metal region 32 and finally to the conductor 39. It can be seen that the dielectric thin film layer 25 merely serves as a protective covering for the underlying p-type semiconductor material 23 and is in no way a part of the circuit configuration of the tunnel diode. For this reason suitable materials other than the preferred silicon oxide are practical for use in such a procedure.

The capacitive area that affects the cutoff frequency of the diode is the area of the vertical tunnel junction between the p and n-type semiconductor materials. The horizontal interface area between the p-type semiconductor material 23 and the dielectric thin film 25 and the horizontal interface area between the p-type semiconductor material 23 and the insulating substrate 22 do not contribute to junction capacitance.

Figure 11:
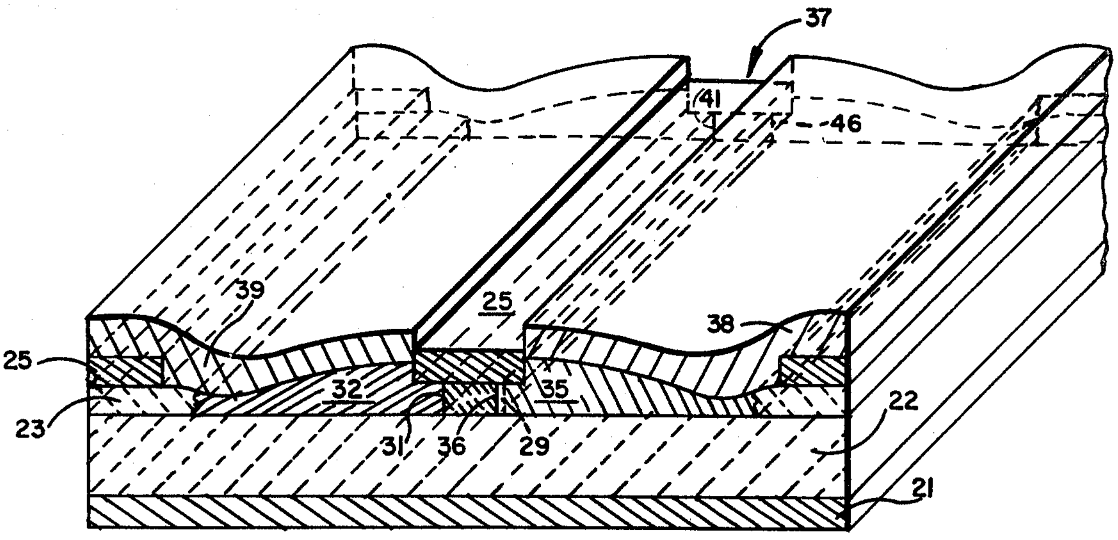
FIG. 11 is a perspective cross-sectional view of a completed tunnel diode.

A cross-section perspective of the monolithic heteroepitaxial microwave tunnel diode is shown in FIG. 11. Interface 36 and interface 46 define the depth of the tunnel junction. Since the thickness of the epitaxial p-type semiconductor material is fixed, the cross-sectional area of the tunnel junction can be controlled by the depth of the diode (where depth is measured perpendicular to the plane of the drawing). By bringing end 46 closer to end 36, a reduced area tunnel junction (and thus reduced capacitance) is achieved. On any given wafer 24 (FIG. 5) various size "windows" can be formed in the dielectric thin film. Therefore, for any given wafer 24 microwave tunnel diodes with different cutoff frequencies can be achieved from the same wafer. As one desires, a larger or smaller area of tunnel junction can be obtained merely by changing the size of the "window". Conversely, for a given "-window" size, groups of tunnel diodes with different cutoff frequencies can be obtained by varying the thickness of the p-type semiconductor layer. This is a significant feature of this invention. As noted in the Brief Description of the Prior Art, old methods require etching techniques after forming the tunnel junction to obtain a suitable cross-sectional area.

FIG. 11 depicts the tunnel diode in linear arrangement. It is, of course, within the scope of this invention that other arrangements may be used. For instance, circular "windows" could be formed in the dielectric thin film before deposition of the metals as previously described. Circular "windows" would provide a variation in the electric field characteristics of the diode. The capacitive tunnel junction area would also be cylindrical as opposed to the linear arrangement of FIG. 11.

Another variation from the description of the preferred embodiment is to form both "windows" or sets of "windows" in the dielectric thin film at the same time or before any alloying steps. Then a suitable metal, such as the sulfur doped tin could be used as the metal for both the contacts. This is a much simplified operation and also avoids use of a metal such as zinc that may pose manufacturing difficulties. Characteristics of the diode would, of course, vary with the selection of metal for the contacts.

Still another variation from the preferred embodiment is the interchanging of the p and n-type semiconductor materials. That is, utilize an epitaxial layer of n-type semiconductor material with the growth of a p-type semiconductor layer at the tunnel junction.

In actual practice tunnel diodes of the method and structure of this invention were constructed using sapphire as an insulating substrate. A layer of gallium arsenide zinc doped to an acceptor concentration of $2 \times 10^{19}/cm^3$ at a thickness of 6 microns was used as the p-type semiconductor material. Zinc was used as the first metal forming the ohmic contact and sulfur doped tin at maximum solubility served as the n-type semiconductor material. Silicon oxide was used as the dielectric thin film mask covering the p-type semiconductor material. The metal alloying of the first metal (zinc) was done at 380° C. in a forming gas atmosphere and the second metal (sulfur doped tin) was alloyed at 500° C. in forming gas atmosphere.

Tunnel diodes with peak to valley current ratios as high as 20:1 and typically 10:1 were obtained. The diodes sustained peak currents as high as 60 milliamperes.

While there has been shown what is considered to be the preferred embodiment of the method of this invention it will be manifest that many changes and modifications may be made therein without departing from the essential spirit of the invention. It is intended, therefore, in the annexed claims, to cover all of these changes and modifications as may fall within the true scope of the invention.

We claim:

1. A monolithic microwave heteroepitaxial tunnel diode comprising in combination:

a. a layer of dielectric substrate;

b. a layer of p-type semiconductor material epitaxially disposed on said dielectric substrate;

c. a layer of dielectric thin film covering preselected regions of said layer of p-type semiconductor material and intimate therewith to form an alloying limitation mask;

d. a first metal alloyed through a preselected first opening in said thin film layer forming an ohmic contact by a eutectic mixture penetrating through said p-type semiconductor material and under said thin film, said ohmic contact vertically extending from said thin film through said semiconductor layer to said insulating substrate;

e. a second metal alloyed through a preselected second opening in said thin film layer forming a p-n junction by a eutectic mixture penetrating through said semiconductor layer and under said thin film layer toward said ohmic contact, said p-n junction vertically extending through said semiconductor layer from said thin film to said insulating layer, said p-n junction being formed in proximity to said ohmic contact but separated therefrom by a remaining region of p-type semiconductor material;

f. means providing electrical contacts to said first and second metals.

2. The device of claim 1 comprising in addition a metal ground plane intimate to said dielectric substrate but not in contact with any other metal or semiconductor material.

3. The device of claim 1 wherein there is an interchange of the p and n-type materials and a layer of n-type semiconductor material is epitaxially deposited on said dielectric substrate instead of said p-type material and a p-type region is grown at the interface of said n-type semiconductor material to form said p-n junction.

4. The device of claim 1 wherein said dielectric substrate is selected from a group consisting of aluminum oxide, beryllium oxide and sapphire.

5. The device of claim 1 wherein said p-type semiconductor is degenerate gallium arsenide.

6. The device of claim 5 wherein said degenerate gallium arsenide is doped with zinc.

7. The device of claim 6 wherein said degenerate gallium arsenide is doped to an acceptor concentration of $2 \times 10^{19}/cm^3$.

8. The device of claim 1 wherein said first metal is selected from a group consisting of zinc, silver, cadmium and indium.

9. The device of claim 1 wherein said layer of p-type semiconductor has a thickness between 1 and 25 microns.

10. The device of claim 1 wherein said second metal used for producing the p-n junction consists of sulfur mixed with tin.

11. The device of claim 10 wherein the amount of tin is mixed with the maximum soluble amount of sulfur.

12. The device of claim 1 wherein said dielectric thin film is made from silicon oxide and silicon nitride.

13. The device of claim 1 wherein the alloying into of said first metal used for producing the ohmic contact zone is effected at a temperature of about 300° C.

14. The device of claim 1 wherein the alloying into of said second metal used for the production of the p-n junction is effected at temperatures between 380° and 500° C.

15. The device of claim 1 wherein the alloying into of said second metal used for producing the p-n junction is effected in a reducing atmosphere.

* * * * *